(12) United States Patent
Kim et al.

(10) Patent No.: US 11,569,209 B2
(45) Date of Patent: Jan. 31, 2023

(54) SEMICONDUCTOR PACKAGE

(71) Applicant: SAMSUNG ELECTRONICS CO., LTD., Suwon-si (KR)

(72) Inventors: Sangsoo Kim, Cheonan-si (KR); Sehun Ahn, Asan-si (KR); Pilsung Choi, Cheonan-si (KR); Sung-Kyu Park, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1 day.

(21) Appl. No.: 17/236,138

(22) Filed: Apr. 21, 2021

(65) Prior Publication Data
US 2022/0068895 A1     Mar. 3, 2022

(30) Foreign Application Priority Data
Aug. 25, 2020 (KR) ........................ 10-2020-0106917

(51) Int. Cl.
| | |
|---|---|
| *H01L 25/10* | (2006.01) |
| *H01L 23/00* | (2006.01) |
| *H01L 23/31* | (2006.01) |
| *H01L 23/538* | (2006.01) |
| *H01L 21/48* | (2006.01) |
| *H01L 25/00* | (2006.01) |
| *H01L 21/56* | (2006.01) |

(52) U.S. Cl.
CPC ........ *H01L 25/105* (2013.01); *H01L 21/4853* (2013.01); *H01L 21/565* (2013.01); *H01L 23/3128* (2013.01); *H01L 23/3135* (2013.01); *H01L 23/5389* (2013.01); *H01L 24/16* (2013.01); *H01L 25/50* (2013.01); *H01L 2224/16227* (2013.01); *H01L 2225/1035* (2013.01); *H01L 2225/1058* (2013.01); *H01L 2924/18161* (2013.01); *H01L 2924/19041* (2013.01); *H01L 2924/19106* (2013.01)

(58) Field of Classification Search
CPC combination set(s) only.
See application file for complete search history.

(56) References Cited

U.S. PATENT DOCUMENTS

| | | |
|---|---|---|
| 5,939,782 A | 8/1999 | Malladi |
| 6,400,576 B1 | 6/2002 | Davidson |
| 6,535,398 B1 | 3/2003 | Moresco |
| 6,894,385 B1 | 5/2005 | Jafari et al. |
| 6,995,448 B2 | 2/2006 | Lee et al. |

(Continued)

*Primary Examiner* — Fernando L Toledo
*Assistant Examiner* — Neil R Prasad
(74) *Attorney, Agent, or Firm* — F. Chau & Associates, LLC

(57) ABSTRACT

A semiconductor package includes a substrate having a first surface and a second surface opposite to the first surface. A semiconductor chip is on the first surface of the substrate. A passive element is on the second surface of the substrate. The substrate includes a first passive element pad and a second passive element pad that are exposed by the second surface. A dam extends downwardly from the second surface. The dam includes a first dam and a second dam. The passive element is disposed between the first dam and the second dam. The passive element includes a first electrode portion electrically connected to the first passive element pad. A second electrode portion is electrically connected to the second passive element pad.

20 Claims, 16 Drawing Sheets

(56) References Cited

U.S. PATENT DOCUMENTS

| | | | |
|---|---|---|---|
| 7,224,058 B2 | 5/2007 | Fernandez | |
| 2003/0198034 A1* | 10/2003 | Pu | H01L 25/0652 |
| | | | 257/E25.011 |
| 2006/0030075 A1* | 2/2006 | Sugiyama | H01L 24/29 |
| | | | 257/E21.503 |
| 2006/0081980 A1* | 4/2006 | Fernandez | H01L 25/0652 |
| | | | 257/E23.092 |
| 2017/0256577 A1* | 9/2017 | Inoue | H01L 27/14 |

* cited by examiner

SEMICONDUCTOR PACKAGE

CROSS-REFERENCE TO RELATED APPLICATION

This application claims priority under 35 U.S.C. § 119 to Korean Patent Application No. 10-2020-0106917, filed on Aug. 25, 2020 in the Korean Intellectual Property Office, the disclosure of which is incorporated by reference in its entirety herein.

1. Technical Field

Embodiments of the present inventive concepts relate to a semiconductor package and a method of manufacturing the same, and more particularly, to a semiconductor package that reduces a volume and prevents rotation of a passive element and a method of manufacturing the same.

2. Discussion of Related Art

An integrated circuit chip may be realized in the form of a semiconductor package for application to an electronic product. Typically, a semiconductor chip may be mounted on a substrate such as a printed circuit board (PCB), thereby forming the semiconductor package. A plurality of semiconductor chips may be mounted in a single semiconductor package. The plurality of semiconductor chips may have various functions. A package-on-package structure in which a package is coupled on another package may be used. Various components in addition to a semiconductor chip may be coupled to a substrate of a semiconductor package. For example, a passive element, such as a capacitor, may be coupled to the substrate. The passive element may be coupled to the inside of the substrate, a top surface of the substrate or a bottom surface of the substrate to perform various functions.

SUMMARY

Embodiments of the present inventive concepts may provide a semiconductor package that prevents rotation of a passive element and a method of manufacturing the same.

Embodiments of the present inventive concepts may also provide a semiconductor package that prevents an electrical short of a passive element and a method of manufacturing the same.

Embodiments of the present inventive concepts may also provide a semiconductor package that increases a yield and a method of manufacturing the same.

Embodiments of the present inventive concepts may also provide a semiconductor package that reduces a total volume and a method of manufacturing the same.

According to an embodiment of the present inventive concepts, a semiconductor package includes a substrate having a first surface and a second surface opposite to the first surface. A semiconductor chip is on the first surface of the substrate. A passive element is on the second surface of the substrate. The substrate includes a first passive element pad and a second passive element pad that are exposed by the second surface. A dam extends downwardly from the second surface. The dam includes a first dam and a second dam. The passive element is disposed between the first dam and the second dam. The passive element includes a first electrode portion electrically connected to the first passive element pad. A second electrode portion is electrically connected to the second passive element pad.

According to an embodiment of the present inventive concepts, a semiconductor package includes a substrate. A semiconductor chip is on a top surface of the substrate. A passive element is on a bottom surface of the substrate. The substrate includes a first passive element pad and a second passive element pad that are exposed by the bottom surface of the substrate. A dam extends downwardly from the bottom surface of the substrate. The dam is disposed between the first passive element pad and the second passive element pad when viewed in a plan view. The passive element includes a first electrode portion electrically connected to the first passive element pad. A second electrode portion is electrically connected to the second passive element pad.

According to an embodiment of the present inventive concepts, a semiconductor package may include a substrate having a first surface and a second surface. The first surface is spaced apart from the second surface in a first direction. A semiconductor chip is on the first surface of the substrate. A molding layer is disposed on the first surface and surrounds the semiconductor chip. An upper package part is on the molding layer. A passive element is on the second surface of the substrate. The substrate includes a first passive element pad exposed by the second surface. A second passive element pad is exposed by the second surface and is spaced apart from the first passive element pad in a second direction intersecting the first direction. A dam extends from the second surface in a direction opposite to the first direction. The dam includes a first dam disposed between the first passive element pad and the second passive element pad when viewed in a plan view. A second dam is disposed between the first passive element pad and the second passive element pad in a plan view and is spaced apart from the first dam in a third direction intersecting the first direction and the second direction. The passive element is disposed between the first dam and the second dam. The passive element includes a first electrode portion electrically connected to the first passive element pad. A second electrode portion is electrically connected to the second passive element pad.

According to an embodiment of the present inventive concepts, a semiconductor package includes a substrate having a first surface and a second surface opposite to the first surface. A semiconductor chip is on the first surface of the substrate. A passive element is on the second surface of the substrate. The substrate includes a first passive element pad and a second passive element pad that are exposed by the second surface. A dam extends downwardly from the second surface. The dam includes a first dam and a second dam. The passive element is disposed between the first dam and the second dam and is electrically connected to the first passive element pad and the second passive element pad. The passive element is configured to be rotated while maintaining electrical connection to the first passive element pad and the second passive element pad. The passive element directly contacts the dam when the passive element is rotated at a first angle of rotation. The dam is configured to prevent rotation of the passive element at an angle greater than the first angle of rotation.

BRIEF DESCRIPTION OF THE DRAWINGS

The present inventive concepts will become more apparent in view of the attached drawings and accompanying detailed description.

DETAILED DESCRIPTION OF EMBODIMENTS

Figure 1:
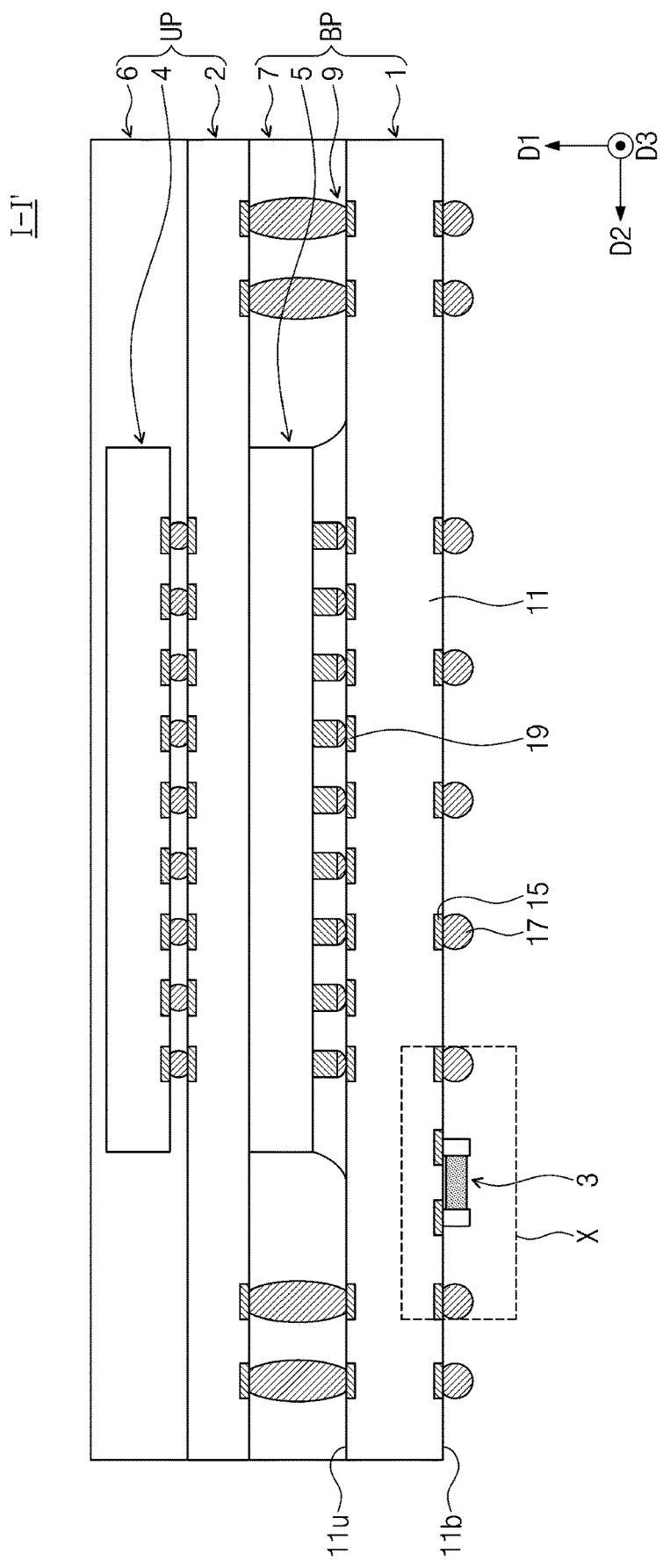
FIG. 1 is a cross-sectional view taken along line I-I' of FIG. 3 illustrating a semiconductor package according to an embodiment of the present inventive concepts.

Hereinafter, embodiments of the present inventive concepts will be described in detail with reference to the accompanying drawings. The same reference numerals or the same reference designators may denote the same elements or components throughout the specification.

Figure 2:
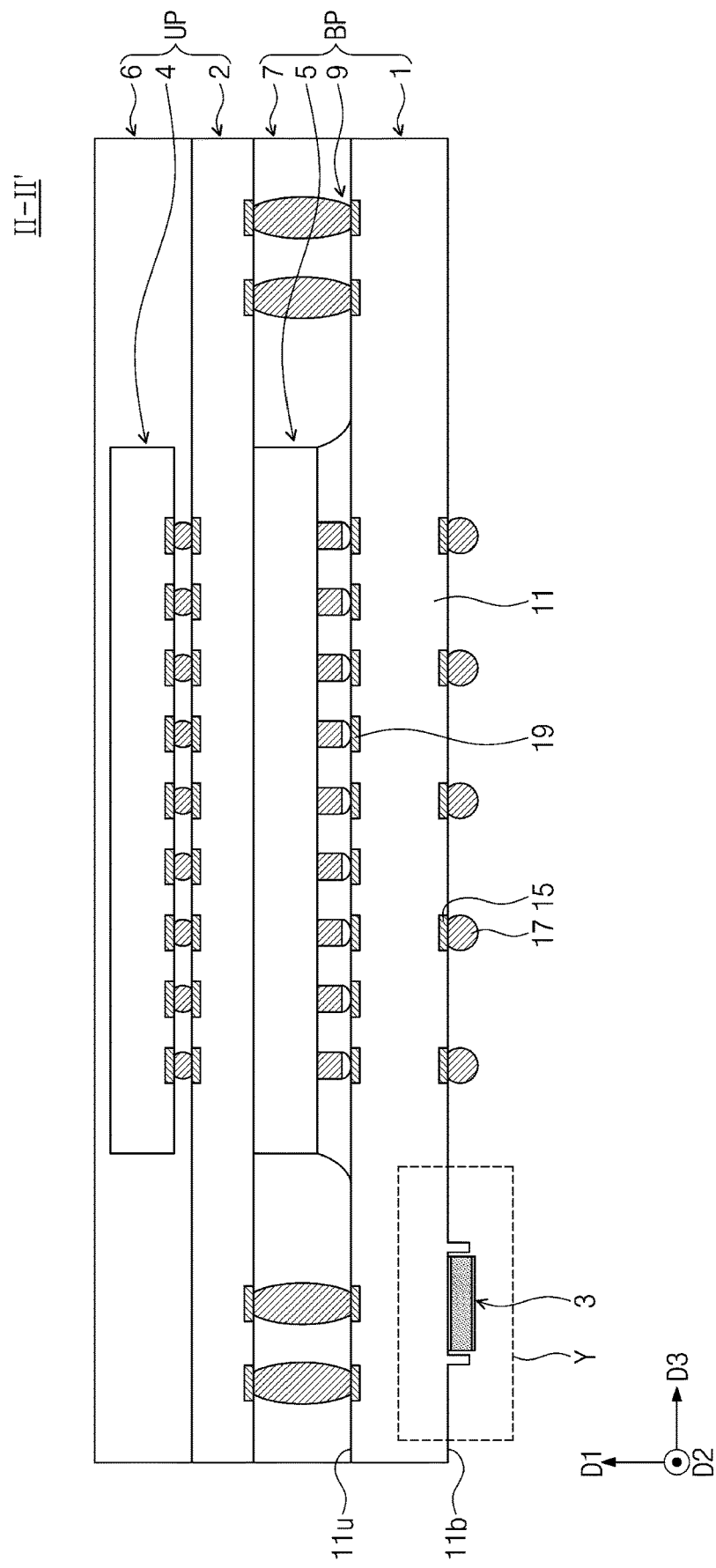
FIG. 2 is a cross-sectional view taken along line II-II' of FIG. 3 illustrating a semiconductor package according to an embodiment of the present inventive concepts.
Figure 3:
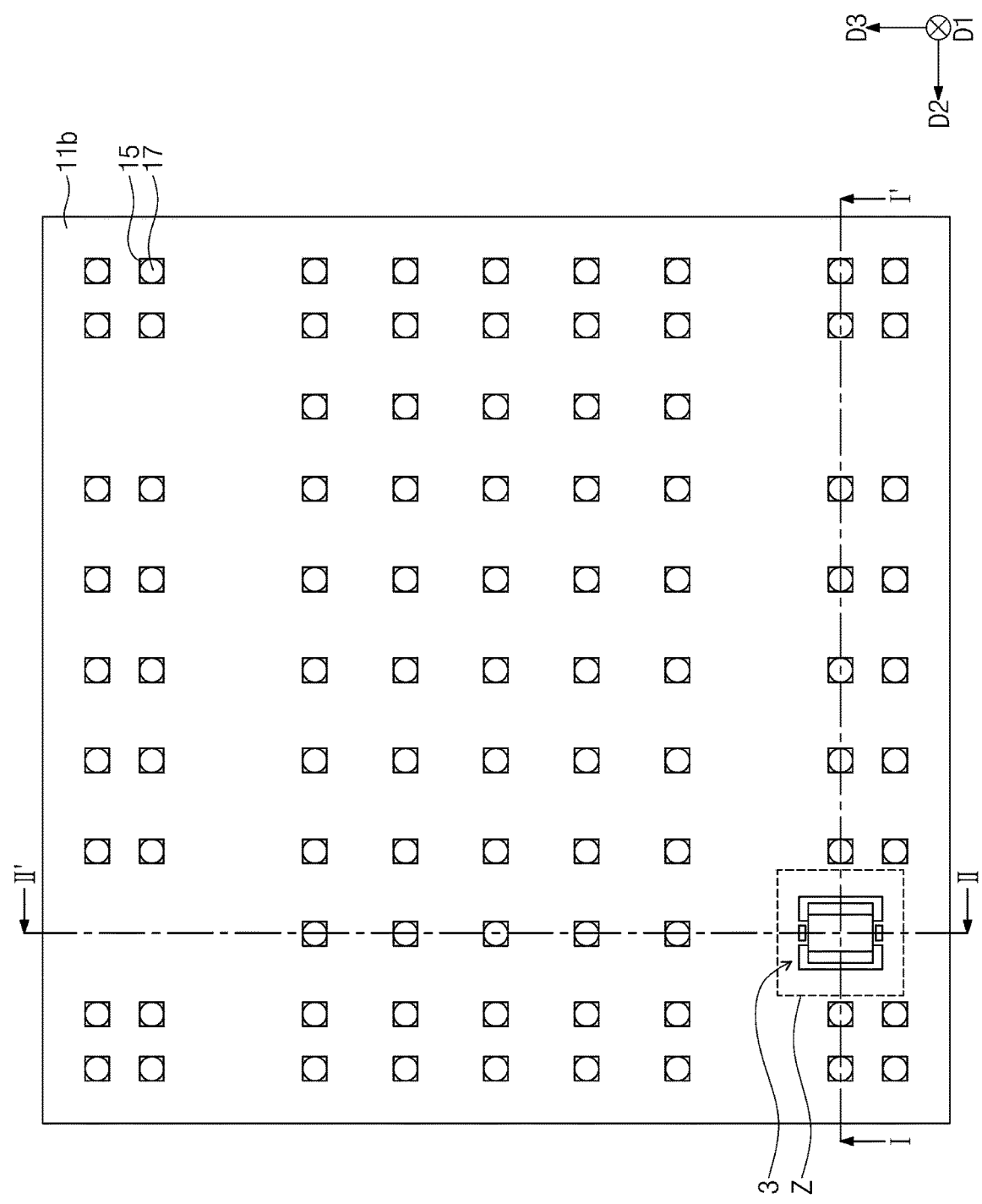
FIG. 3 is a bottom view illustrating a semiconductor package according to an embodiment of the present inventive concepts.

FIG. 1 is a cross-sectional view taken along a line I-I' of FIG. 3 to illustrate a semiconductor package according to an embodiment of the present inventive concepts, FIG. 2 is a cross-sectional view taken along a line II-II' of FIG. 3, and FIG. 3 is a bottom view illustrating a semiconductor package according to embodiments of the present inventive concepts.

Hereinafter, the reference character D1 of FIG. 1 may be referred to as a first direction, and a reference character D2 of FIG. 1 may be referred to as a second direction. As shown in FIG. 1, the second direction D2 intersects the first direction D1. For example, the second direction D2 may be perpendicular to the first direction D1. However, embodiments of the present inventive concepts are not limited thereto. A reference character D3 intersecting the first and second directions D1 and D2 in FIG. 1 may be referred to as a third direction.

Referring to the embodiment of FIG. 1, a semiconductor package may be provided. In an embodiment, the semiconductor package may include a lower package part BP and an upper package part UP. For example, as shown in the embodiment of FIG. 1, a lower surface of the upper package part UP may directly contact an upper surface of the lower package part BP. The upper package part UP may be coupled on the lower package part BP. The upper package part UP may be electrically connected to the lower package part BP. For example, the semiconductor package may have a package-on-package (POP) structure in which a package is coupled on another package. However, embodiments of the inventive concepts are not limited thereto. For example, in certain embodiments, the semiconductor package may include a single package. Hereinafter, the package-on-package (POP) type semiconductor package will be described as an example for the purpose of ease and convenience in explanation.

The lower package part BP may include a substrate 1, a passive element 3, a semiconductor chip 5, a molding layer 7, and a connection pillar 9.

The substrate 1 may connect the semiconductor chip 5 to an external device or system. In an embodiment, the substrate 1 may include a printed circuit board (PCB) or a redistribution layer (RDL) substrate. The substrate 1 may include a substrate body 11, a connection pad 15, a connection ball 17, and an upper pad 19. In an embodiment, the substrate 1 may further include a first passive element pad 121 (see FIG. 4) and a second passive element pad 123 (see FIG. 4). In addition, the substrate 1 may further include a first dam 131 (see FIG. 5) and a second dam 133 (see FIG. 5). While the embodiment of FIG. 4 includes a first passive element pad 121 and a second passive element pad 123, in other embodiments the substrate 1 may include three or more passive element pads. While the embodiment of FIG. 5 includes a first dam 131 and a second dam 133, in other embodiments the substrate 1 may include three or more dams.

The substrate body 11 may include an insulating material. An interconnection structure may be disposed in the substrate body 11. A top surface of the substrate body 11 may be referred to as a first surface 11u. As shown in the embodiment of FIG. 1, the top surface of the substrate body 11 may be a top surface of the entire portion of the substrate 1. A bottom surface of the substrate body 11 may be referred to as a second surface 11b. As shown in the embodiment of FIG. 1, the bottom surface of the substrate body 11 may be a bottom surface of the entire portion of the substrate 1. The second surface 11b may be located in a direction opposite to the first surface 11u. For example, the second surface 11b may be opposite to the first surface 11u and the first and second surfaces 11u, 11b may be spaced apart in the first direction D1 which is a thickness direction of the substrate 1. In an embodiment, the first surface 11u and/or the second surface 11b may include a solder resist (SR). The connection pad 15 may be exposed by the second surface 11b. The connection pad 15 may include a conductive material. For example, the connection pad 15 may include a metal. The connection ball 17 may be coupled or bonded to the connection pad 15. For example, as shown in the embodiment of FIG. 1, an upper portion of the connection ball 17 may directly contact a lower portion of the connection pad 15. The connection ball 17 may include a solder ball. The semiconductor package may be electrically connected to the external device or system through the connection pad 15 and the connection ball 17. The connection pad 15 may be provided in plurality, and the connection ball 17 may be provided in plurality. The plurality of connection pads 15 may be spaced apart from each other in the second direction D2 and/or the third direction D3, and the plurality of connection balls 17 may be spaced apart from each other in the second direction D2 and/or the third direction D3. Hereinafter, a single connection pad 15 and a single connection ball 17 will be described for the purpose of ease and convenience in explanation. The upper pad 19 may be exposed by the first surface 11u. The upper pad 19 may include a conductive material. For example, the upper pad 19 may include a metal. The upper pad 19 may be electrically connected to the semiconductor chip 5 and/or the connection pillar 9. In some embodiments, the upper pad 19 may be provided in plurality. The plurality of upper pads 19 may be spaced apart from each other in the second direction D2 and/or the third direction D3. Hereinafter, a single upper pad 19 will be described for the purpose of ease and convenience in explanation. The first passive element pad 121 (see FIG. 4) and the second passive element pad 123 (see FIG. 4) may be exposed by the second surface 11b. The first passive element pad 121, the second passive element pad 123, the first dam 131 (see FIG. 5) and the second dam 133 (see FIG. 5) will be described in detail with reference to the embodiments of FIGS. 4 and 5.

The passive element 3 may be disposed on the bottom surface of the substrate 1. For example, the passive element 3 may be disposed on the second surface 11b. In an embodiment, the passive element 3 may be coupled to a surface (e.g., the bottom surface) of the substrate 1 by a surface mounting technology (SMT). The passive element 3 may be coupled to the first passive element pad 121 (see FIG. 4) and the second passive element pad 123 (see FIG. 4). The passive element 3 may be electrically connected to the substrate 1 through the first passive element pad 121 and the second passive element pad 123. In an embodiment, the passive element 3 may include a capacitor. For example, the passive element 3 may include a decoupling capacitor. However, embodiments of the present inventive concepts are not limited thereto. The passive element 3 will be described later in more detail.

As shown in the embodiment of FIG. 1, the semiconductor chip 5 may be mounted on the substrate 1. The semiconductor chip 5 may be electrically connected to the upper pad 19. In an embodiment, the semiconductor chip 5 may include a memory chip or a logic chip.

The molding layer 7 may surround the semiconductor chip 5 on the substrate 1. For example, the molding layer 7 may surround a lateral side surface of the semiconductor chip 5 (e.g., in the second and/or third directions D2, D3). However, embodiments of the present inventive concepts are not limited thereto. The molding layer 7 may protect the semiconductor chip 5 from external impact and heat. In an embodiment, the molding layer 7 may include an epoxy molding compound (EMC).

The connection pillar 9 may be disposed on the substrate 1. The connection pillar 9 may be electrically connected to the upper pad 19. The connection pillar 9 may connect the substrate 1 and the upper package part UP to each other.

The upper package part UP may be disposed on the lower package part BP. The upper package part UP may include an upper substrate 2, an upper semiconductor chip 4, and an upper molding layer 6. The upper substrate 2 may be electrically connected to the connection pillar 9. The upper semiconductor chip 4 may be mounted on the upper substrate 2. The upper molding layer 6 may surround the upper semiconductor chip 4 on the upper substrate 2. For example, as shown in the embodiment of FIG. 1, the upper molding layer 6 may surround the upper semiconductor chip 4 in the first, second and third directions D1, D2, D3.

Figure 4:
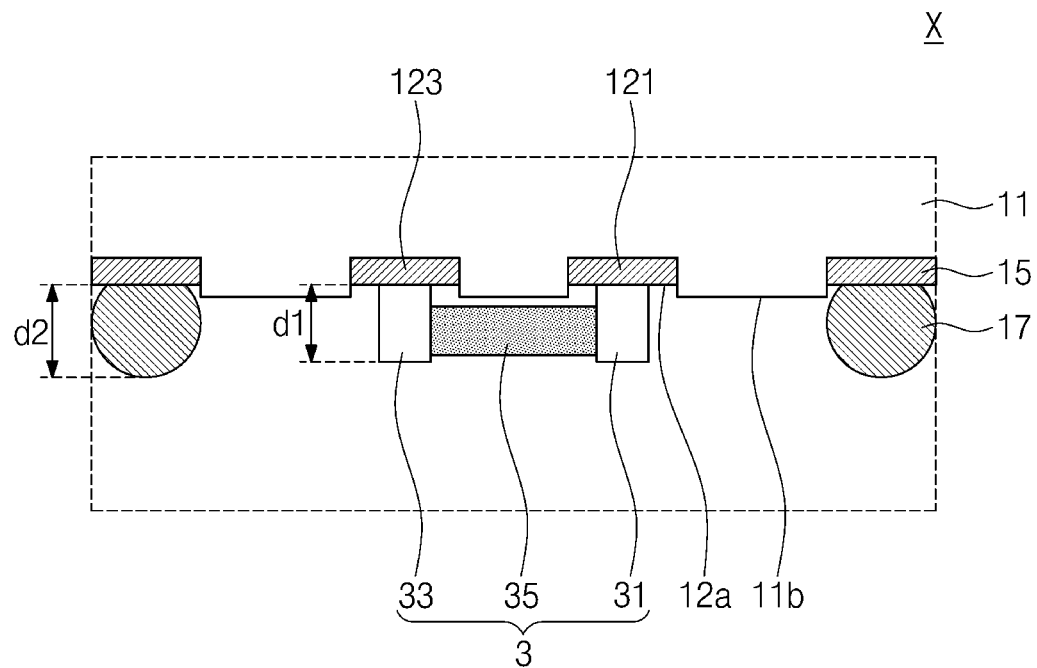
FIG. 4 is an enlarged cross-sectional view of a region X of FIG. 1 according to an embodiment of the present inventive concepts.

FIG. 4 is an enlarged cross-sectional view of region X of FIG. 1.

Referring to the embodiment of FIG. 4, the first passive element pad 121 and the second passive element pad 123 may include a conductive material. The first passive element pad 121 and the second passive element pad 123 may be spaced apart from each other in a horizontal direction (e.g., the second direction D2 and/or the third direction D3). For example, as shown in the embodiment of FIG. 4, the first passive element pad 121 and the second passive element pad 123 may be spaced apart from each other in the second direction D2. The first passive element pad 121 and the second passive element pad 123 may be exposed by the second surface 11b of the substrate 1. A level of a bottom surface 12a of the first passive element pad 121 may be higher (e.g., in the first direction D1) than a level of the second surface 11b. For example, the bottom surface 12a of the first passive element pad 121 may be recessed from the second surface 11b into the substrate 1. The bottom surface of the second passive element pad 123 may be disposed on a substantially same level as the bottom surface of the first passive element pad 121 and may be similarly recessed from the second surface 11b into the substrate 1.

In an embodiment, the passive element 3 may include a first electrode portion 31, a second electrode portion 33, and a dielectric portion 35. However, embodiments of the present inventive concepts are not limited thereto. The first electrode portion 31 and the second electrode portion 33 may include a conductive material. The first electrode portion 31 may be coupled or bonded to the first passive element pad 121. For example, as shown in the embodiment of FIG. 4, a top surface of the first electrode portion 31 may directly contact a lower surface of the first passive element pad 121. The second electrode portion 33 may be coupled or bonded to the second passive element pad 123. For example, as shown in the embodiment of FIG. 4, a top surface of the second electrode portion 33 may directly contact a lower surface of the second passive element pad 123. The first electrode portion 31 may be electrically connected to the first passive element pad 121 and the second electrode portion 33 may be electrically connected to the second passive element pad 123. The dielectric portion 35 may be located between the first electrode portion 31 and the second electrode portion 33 (e.g., in the second and/or third directions D2, D3). In an embodiment in which the passive element 3 includes a multi-layer ceramic capacitor (MLCC), a plurality of thin electrodes may be provided in the dielectric portion 35. For example, one or more conductive material layers may extend from each of the first and second electrode portions 31 and 33 into the dielectric portion 35. In an embodiment, the dielectric portion 35 may include ceramic. However, embodiments of the present inventive concepts are not limited thereto. In an embodiment, the passive element 3 may include another type capacitor. In an embodiment, one of the first and second passive element pads 121 and 123 may be connected to a power electrode, and the other of the first and second passive element pads 121 and 123 may be connected to a ground electrode. For example, the first passive element pad 121 may be electrically connected to the power electrode, and the second passive element pad 123 may be electrically connected to the ground electrode. Thus, the passive element 3 may function as the decoupling capacitor.

A height of the passive element 3 may be referred to as a first thickness d1. The first thickness d1 may be a difference (e.g., length in the first direction D1) between the level of the bottom surface 12a of the first passive element pad 121 and a level of a bottom surface of the passive element 3, such as a bottom surface of the first electrode portion 31. A height of the connection ball 17 may be referred to as a second thickness d2. The second thickness d2 may be a difference (e.g., length in the first direction D1) between the level of the bottom surface of the connection pad 15 and a level of a bottom end of the connection ball 17. In an embodiment, the bottom surface of the connection pad 15 may be disposed at a substantially same level as a bottom surface 12a of the first passive element pad 121. As shown in the embodiment of FIG. 4, the first thickness d1 may be less than the second thickness d2. For example, in an embodiment the first thickness d1 may be in a range of about 50 μm to about 130 μm. For example, the first thickness d1 may be about 110 μm. The second thickness d2 may be in a range of about 130 μm to about 170 μm. For example, the second thickness d2 may be about 150 μm. However, embodiments of the present inventive concepts are not limited thereto. For example, the first thickness d1 and the second thickness d2 may be variously changed depending on a design of the semiconductor package.

In the semiconductor package according to an embodiment of the present inventive concepts, the passive element 3 may be coupled to the bottom surface of the substrate by the surface mounting technology (SMT). A position of the passive element 3 may be changed from the inside of the substrate to the outside of the substrate, and thus a thickness of the substrate body may be reduced. In addition, the position of the passive element may laterally overlap with the connection ball. Thus, a total thickness of the substrate including the connection ball may be reduced.

In the semiconductor package according to embodiments of the present inventive concepts, the thickness of the passive element may be less than the thickness of the connection ball. Thus, it is possible to prevent bonding failure of the connection ball when the connection ball is mounted on an external main board. As a result, a yield of the semiconductor package may be increased.

Figure 5:
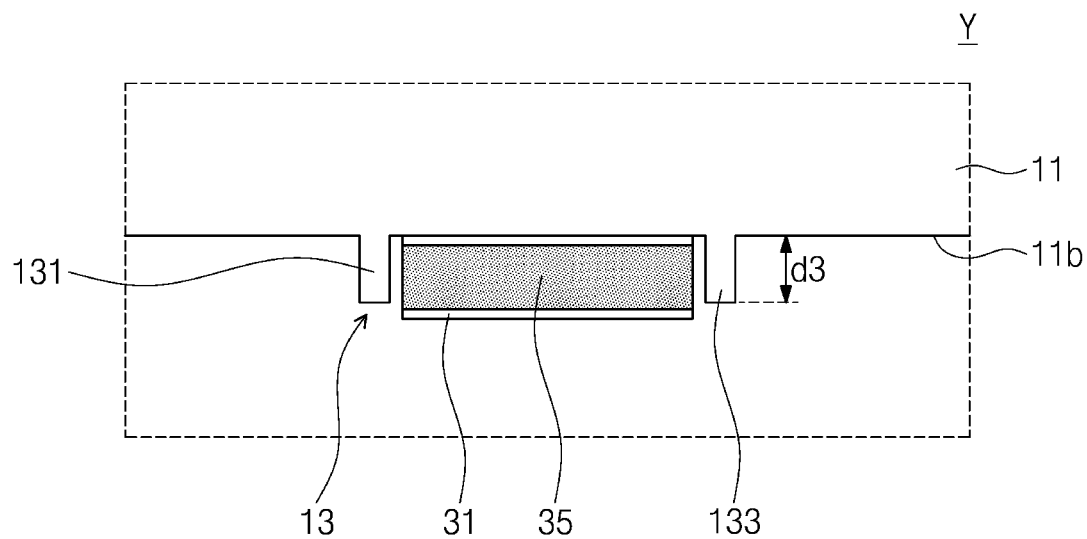
FIG. 5 is an enlarged cross-sectional view of region Y of FIG. 2 according to an embodiment of the present inventive concepts.

FIG. 5 is an enlarged cross-sectional view of a region Y of FIG. 2.

Referring to the embodiment of FIG. 5, the first dam 131 and the second dam 133 may be provided on the second surface 11b of the substrate. The first dam 131 and the second dam 133 may extend downwardly (e.g., in a direction opposite to the first direction D1) from the second surface 11b. The first dam 131 and the second dam 133 may be connected continuously to the substrate body 11. In an embodiment, the first dam 131 and the second dam 133 may include the same material as the material forming the second surface 11b. For example, in an embodiment, the first dam 131 and the second dam 133 may include a solder resist (SR). The first dam 131 and the second dam 133 may be spaced apart from each other in a horizontal direction. For example, as shown in the embodiment of FIGS. 2 and 5, the second dam 133 may be spaced apart from the first dam 131 in the third direction D3. The passive element 3 may be disposed between the first dam 131 and the second dam 133 (e.g., in the third direction D3). A height of the first dam 131 and/or the second dam 133 may be referred to as a third thickness d3. The third thickness d3 may mean a difference (e.g., length in the first direction D1) between a level of the second surface 11b and a level of a bottom surface of the first dam 131 and/or a level of a bottom surface of the second dam 133. As shown in the embodiment of FIG. 5, the bottom surfaces of the first dam 131 and the second dam 133 may be substantially at a same level. As shown in FIGS. 4-5, the third thickness d3 may be less than the first thickness d1. For example, the level of the bottom surface of the passive element 3 may be lower (e.g., in the first direction D1) than the level of the bottom surface of the first dam 131 and/or the second dam 133. For example, in an embodiment the third thickness d3 may be in a range of about 30 μm to about 90 μm. For example, the third thickness d3 may be about 60 μm. However, embodiments of the present inventive concepts are not limited thereto. For example, the thickness of the dam, such as the first dam 131 and the second dam 133, may be variously set depending on a design of the semiconductor package.

Figure 6:
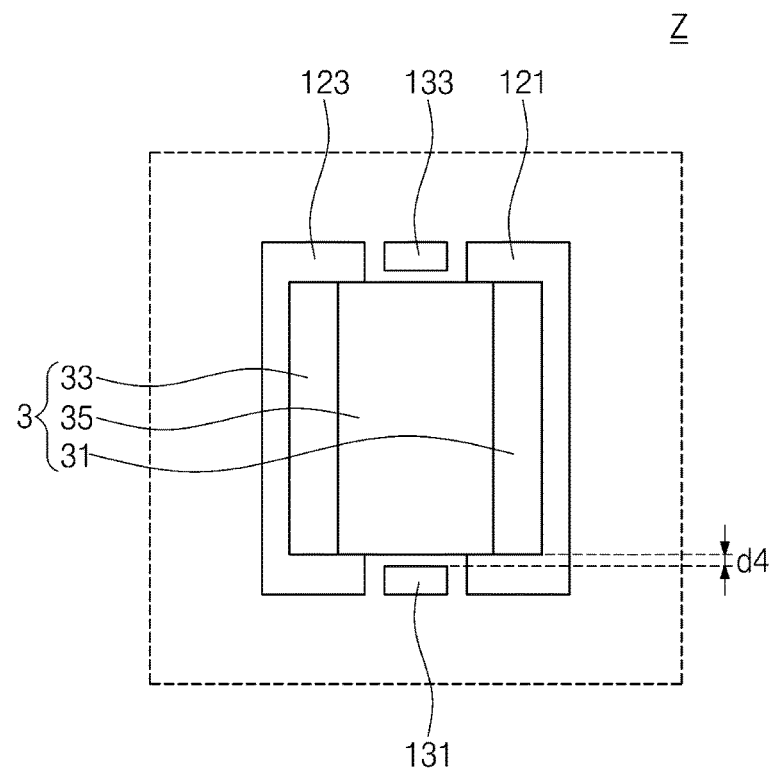
FIGS. 6 and 7 are enlarged bottom views of region Z of FIG. 3 according to embodiments of the present inventive concepts.
Figure 7:
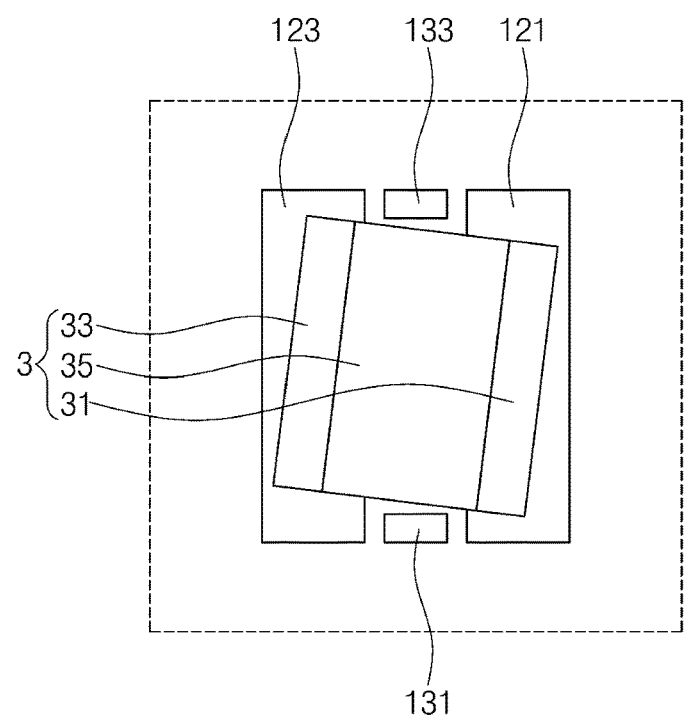

FIGS. 6 and 7 are enlarged bottom views of a region 'Z' of FIG. 3.

Referring to the embodiment of FIG. 6, the first dam 131 and the second dam 133 may be disposed between the first passive element pad 121 and the second passive element pad 123 (e.g., in the second direction D2). For example, each of the first and second dams 131, 133 may be disposed between the first passive element pad 121 and the second passive element pad 123 when viewed in a plan view. The passive element 3 may be disposed between the first dam 131 and the second dam 133 (e.g., in the third direction D3). A distance (e.g., length in the third direction D3) between the passive element 3 and the first dam 131 may be referred to as a first distance d4. The first distance d4 may be determined in consideration of a size of the passive element pad, a size of the passive element, and a size of the dam.

Referring to the embodiment of FIG. 7, the passive element 3 may be rotated while being coupled onto the first passive element pad 121 and the second passive element pad 123. For example, the passive element 3 may be rotated on an axis of a normal line of the second surface 11b by receiving force while in a state of being disposed on the second surface 11b. When the passive element 3 is rotated at a certain angle or more, the passive element 3 may be in direct contact with the first dam 131 and the second dam 133. When the passive element 3 is in direct contact with the first dam 131 and the second dam 133, the rotation of the passive element 3 may be stopped. For example, the first dam 131 and the second dam 133 may block further rotation of the passive element 3. The first dam 131 and the second dam 133 may prevent the passive element 3 from rotating at a certain angle or more. For example, in an embodiment, the first dam 131 and the second dam 133 may prevent the passive element 3 from rotating at angle greater than or equal to 21 degrees. The first dam 131 and the second dam 133 may adjust or control the rotation of the passive element 3 in a numerical range in which an electrical short of the passive element 3 does not occur.

In the semiconductor package according to an embodiment of the present inventive concepts, the dam may prevent the rotation of the passive element past a specific angle. For example, even though the passive element receives force while being coupled to the substrate, the dam may prevent the passive element from rotating at a certain angle or more. Thus, the passive element may be coupled to the first and second passive element pads at a regular position. As a result, a short phenomenon between the passive element and a pad may be prevented. For example, a yield of the semiconductor package may be increased. In addition, since the rotation of the passive element is prevented by the dam, a process of coupling the passive element may be relatively easily performed.

Figure 8:
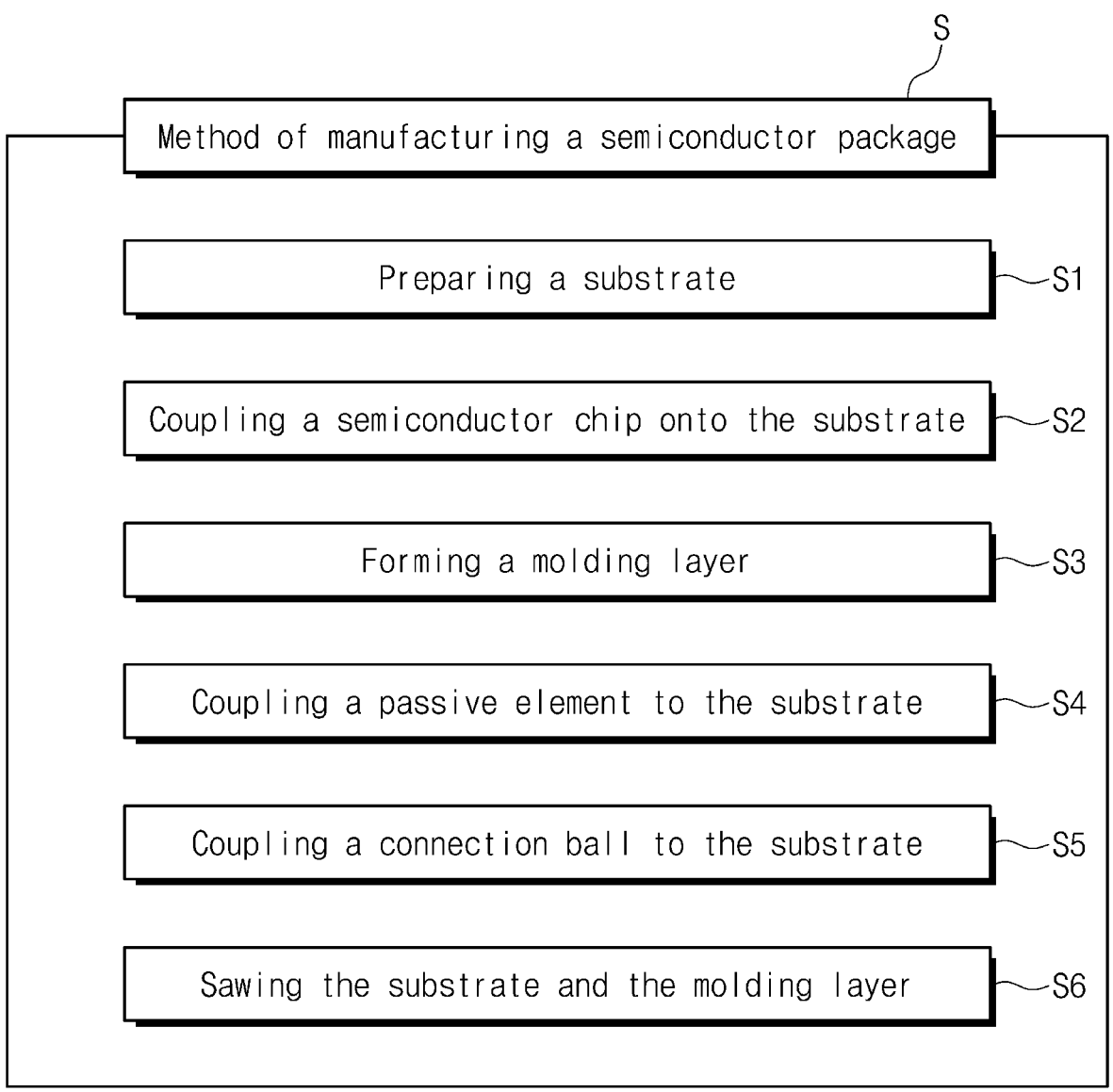
FIG. 8 is a flowchart illustrating a method of manufacturing a semiconductor package, according to an embodiment of the present inventive concepts.

FIG. 8 is a flowchart illustrating a method of manufacturing a semiconductor package, according to an embodiment of the present inventive concepts.

Referring to the embodiment of FIG. 8, a method S of manufacturing a semiconductor package may be provided. The semiconductor package described with reference to the embodiment of FIG. 1 may be manufactured by the method S of manufacturing the semiconductor package. The method S of manufacturing the semiconductor package may include preparing a substrate in block S1, coupling a semiconductor chip onto the substrate in block S2, forming a molding layer in block S3, coupling a passive element to the substrate in block S4, coupling a connection ball to the substrate in block S5, and sawing the substrate and the molding layer in block S6.

Hereinafter, each of the steps of the method S of manufacturing the semiconductor package in the embodiment of FIG. 8 will be described in detail with reference to the embodiments of FIGS. 9 to 14.

FIGS. 9 to 14 are cross-sectional views illustrating the method of manufacturing a semiconductor package according to the embodiment of FIG. 8.

Figure 9:
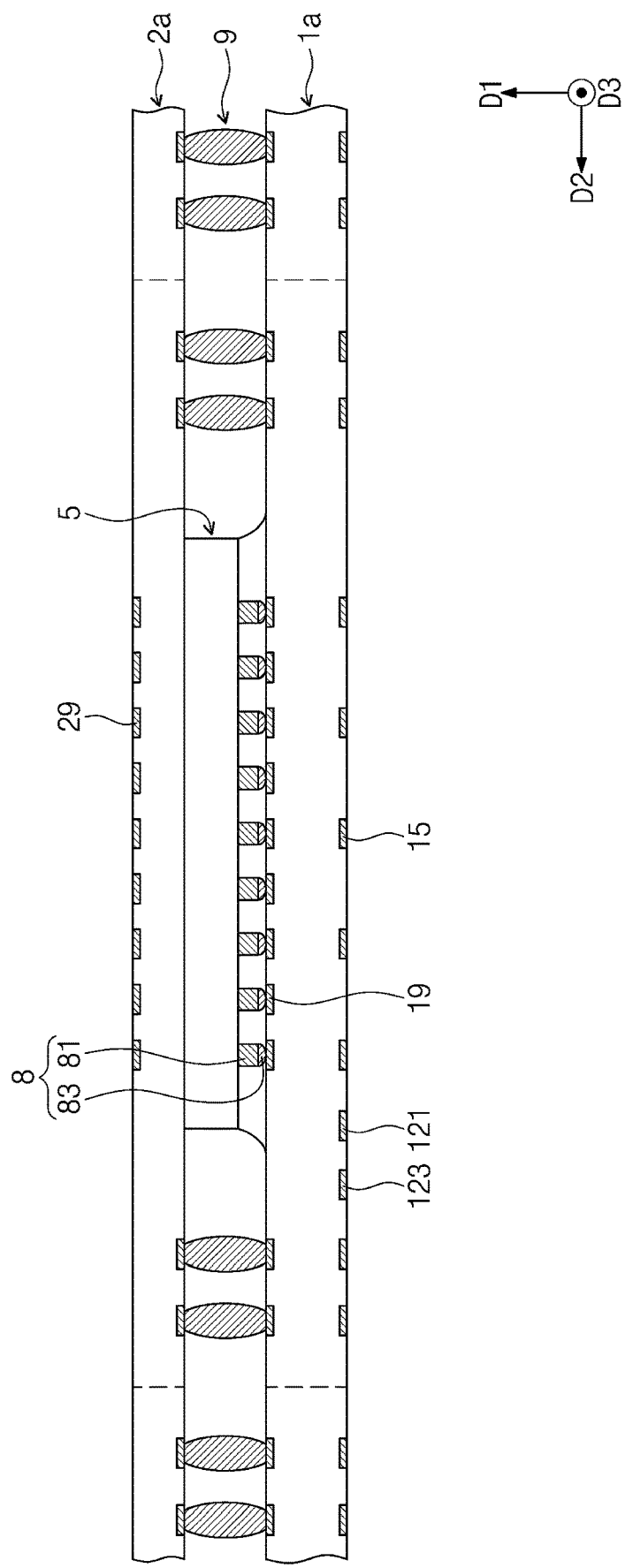
FIGS. 9 to 14 are cross-sectional views illustrating the method of manufacturing a semiconductor package, according to the embodiment of FIG. 8.

Referring to the embodiments of FIGS. 8 and 9, the preparing of the substrate (S1) may include preparing a preliminary substrate 1a in a wafer state and a preliminary upper substrate 2a in a wafer state. As shown in the embodiment of FIG. 9, the preliminary substrate 1a may include a first passive element pad 121 and a second passive element pad 123.

The coupling of the semiconductor chip onto the substrate in block S2 may include mounting a semiconductor chip 5 onto the preliminary substrate 1a. For example, as shown in the embodiment of FIG. 9, the semiconductor chip 5 may be mounted on a top surface of the preliminary substrate 1a. The semiconductor chip 5 may be electrically connected to an upper pad 19 of the preliminary substrate 1a by a connection member 8. The connection member 8 may be connected to the upper pad 19. The upper pad 19 and the semiconductor chip 5 may be electrically connected to each other through the connection member 8. As shown in the embodiment of FIG. 9, the connection member 8 may include a copper pillar 81 and a solder ball 83. However, embodiments of the present inventive concepts are not limited thereto. For example, in some embodiments, the connection member 8 may include only a ball. The connection member 8 may be provided in plurality. The plurality of connection members 8 may be spaced apart from each other in the second direction D2 and/or the third direction D3. Hereinafter, a single connection member 8 will be described for the purpose of ease and convenience in explanation. The preliminary upper substrate 2a may be coupled on the preliminary substrate 1a. The preliminary substrate 1a and the preliminary upper substrate 2a may be electrically connected to each other through a connection pillar 9.

Figure 10:
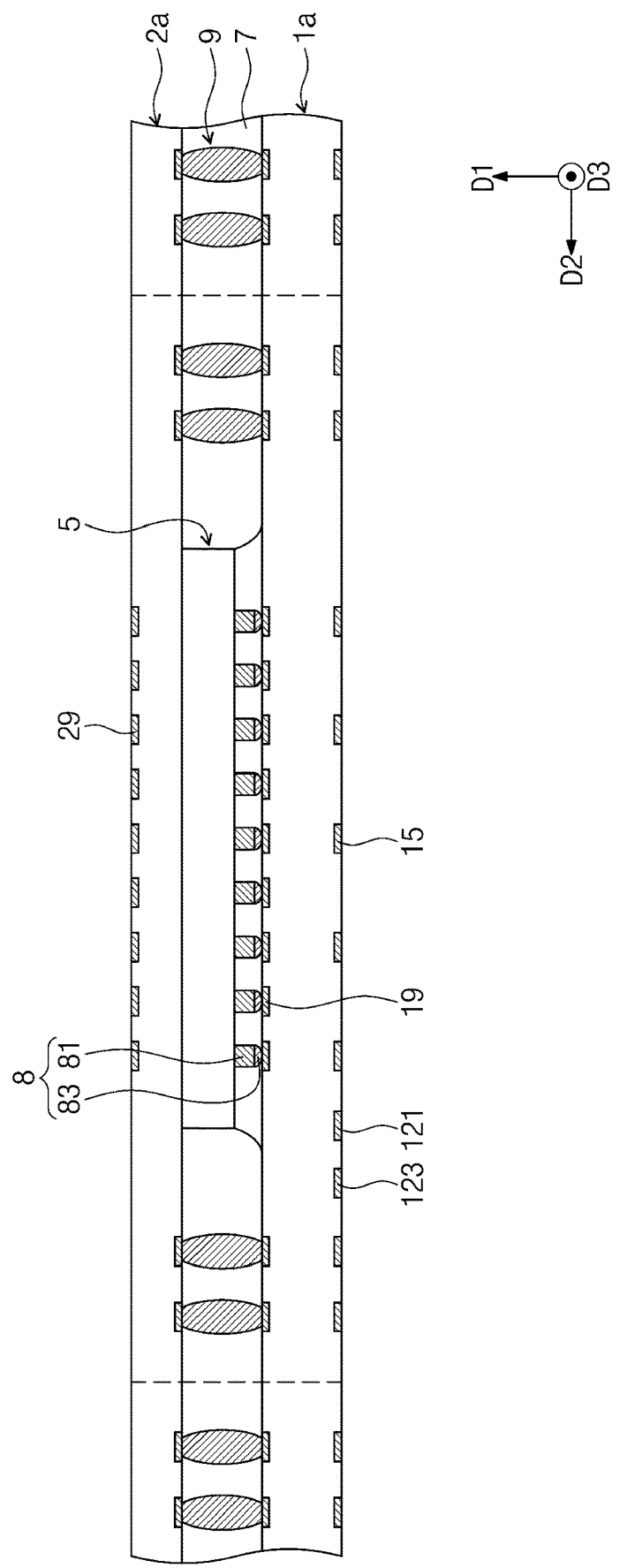

Referring to the embodiments of FIGS. 8 and 10, the forming of the molding layer in block S3 may include forming a molding layer 7 on the preliminary substrate 1a. The molding layer 7 may be formed by a molding process. The molding layer 7 may be disposed between the preliminary substrate 1a and the preliminary upper substrate 2a. In an embodiment, the molding layer 7 may surround a lateral side surface of the semiconductor chip 5 and a side surface of the connection pillar 9 (e.g., in the second and/or third directions D2, D3).

Figure 11:
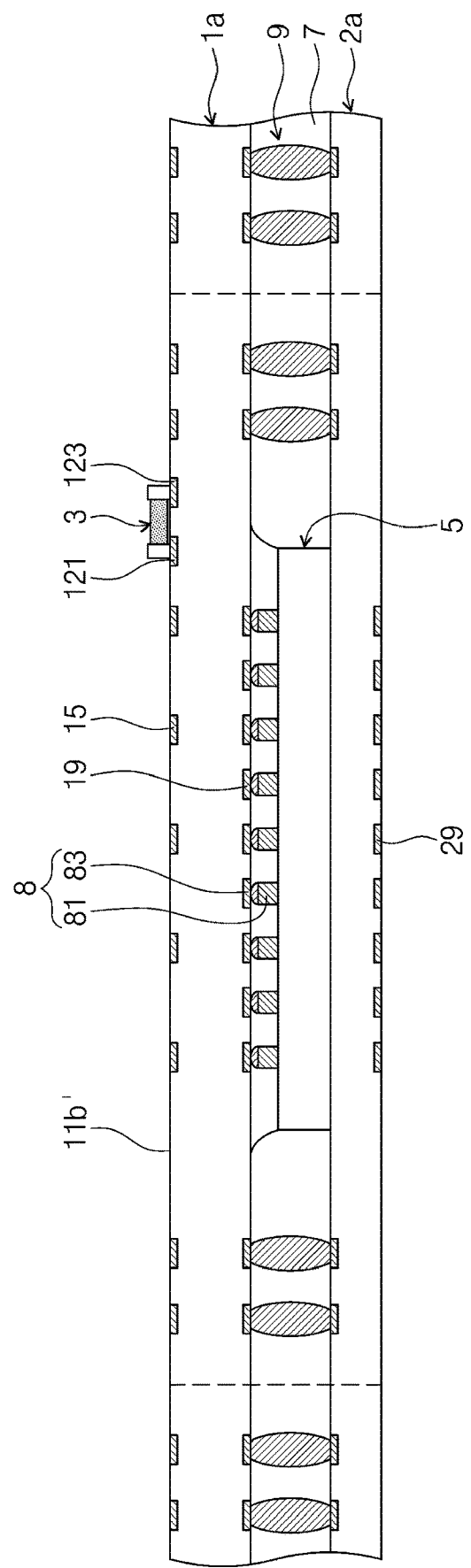

Referring to the embodiments of FIGS. 8 and 11, the coupling of the passive element to the substrate in block S4 may include the coupling of a passive element 3 onto a second surface 11b' of the preliminary substrate 1a. The passive element 3 may be coupled to the first passive element pad 121 and the second passive element pad 123. For example, in an embodiment, the passive element 3 may be coupled to the first passive element pad 121 and the second passive element pad 123 through a reflow process. The passive element 3 may be electrically connected to the preliminary substrate 1a through the first passive element pad 121 and the second passive element pad 123.

Figure 12:
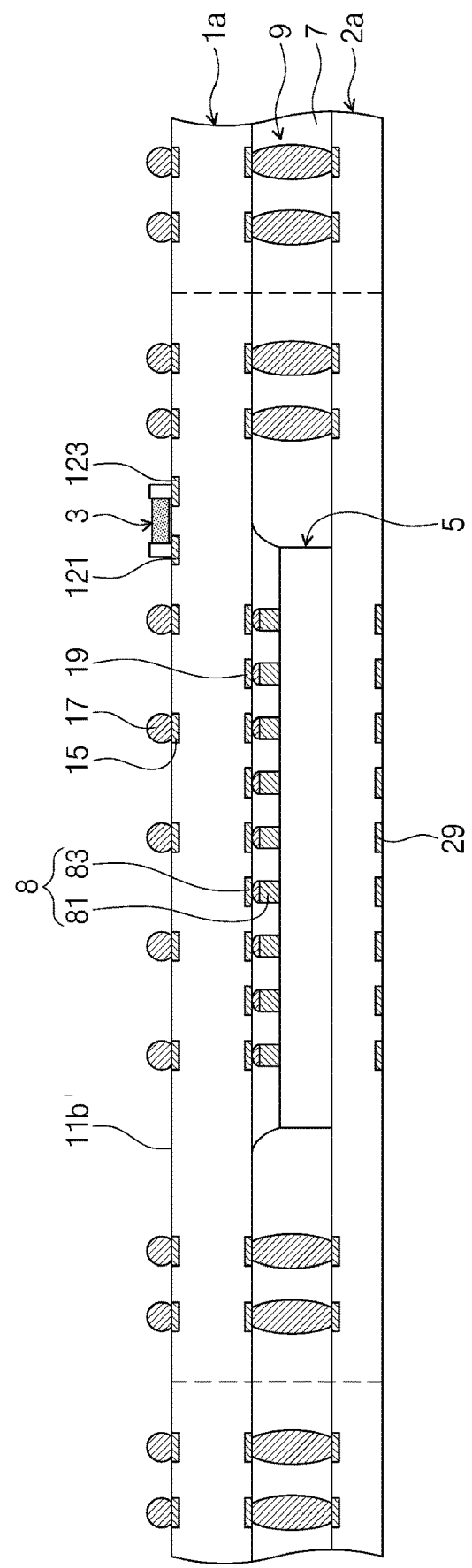

Referring to the embodiments of FIGS. 8 and 12, the coupling of the connection ball to the substrate in block S5 may include coupling a connection ball 17 to a connection pad 15 of the preliminary substrate 1a. In an embodiment, the connection ball 17 may be coupled on the connection pad 15 through a reflow process.

Figure 13:
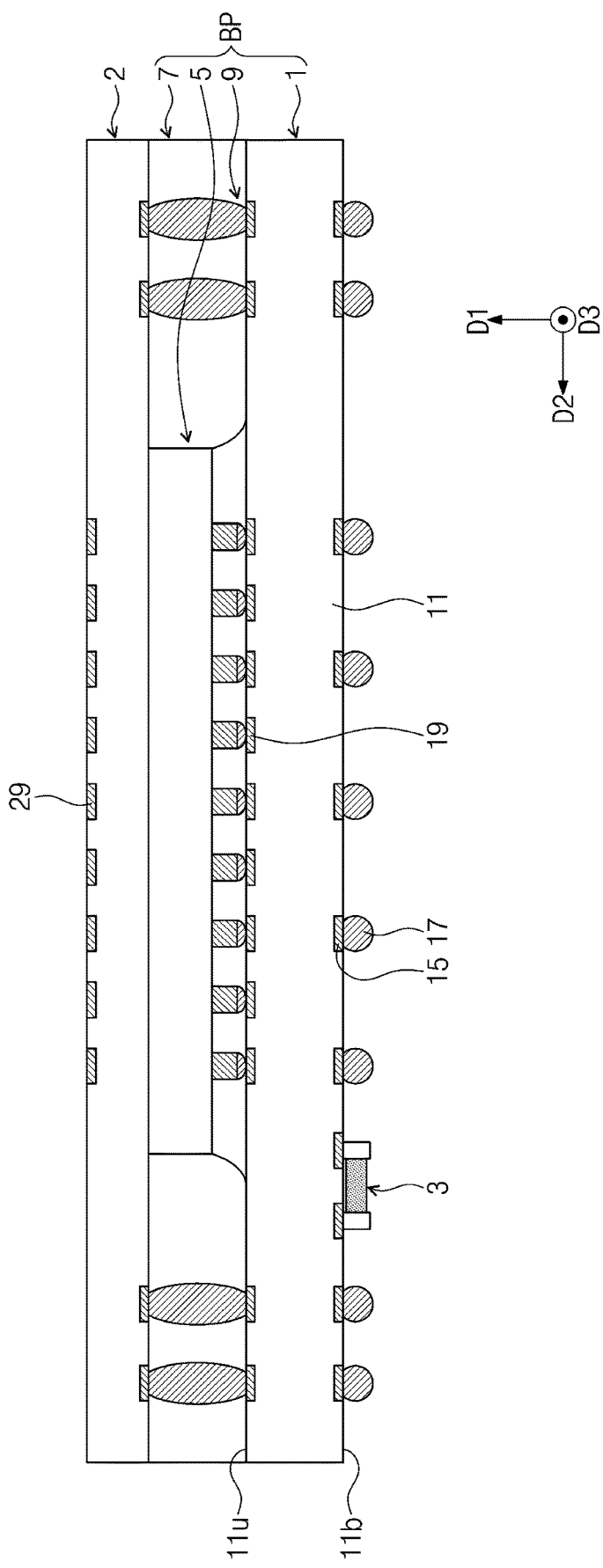

Referring to the embodiments of FIGS. 8 and 13, the sawing of the substrate and the molding layer in block S6 may include sawing the preliminary substrate 1a (see FIG. 12) and the molding layer 7. The preliminary substrate 1a in the wafer state may be sawed to be divided into a plurality of chip shapes. The sawed preliminary substrate 1a may be referred to as a substrate 1. The sawed preliminary upper substrate 2a may be referred to as an upper substrate 2.

Figure 14:
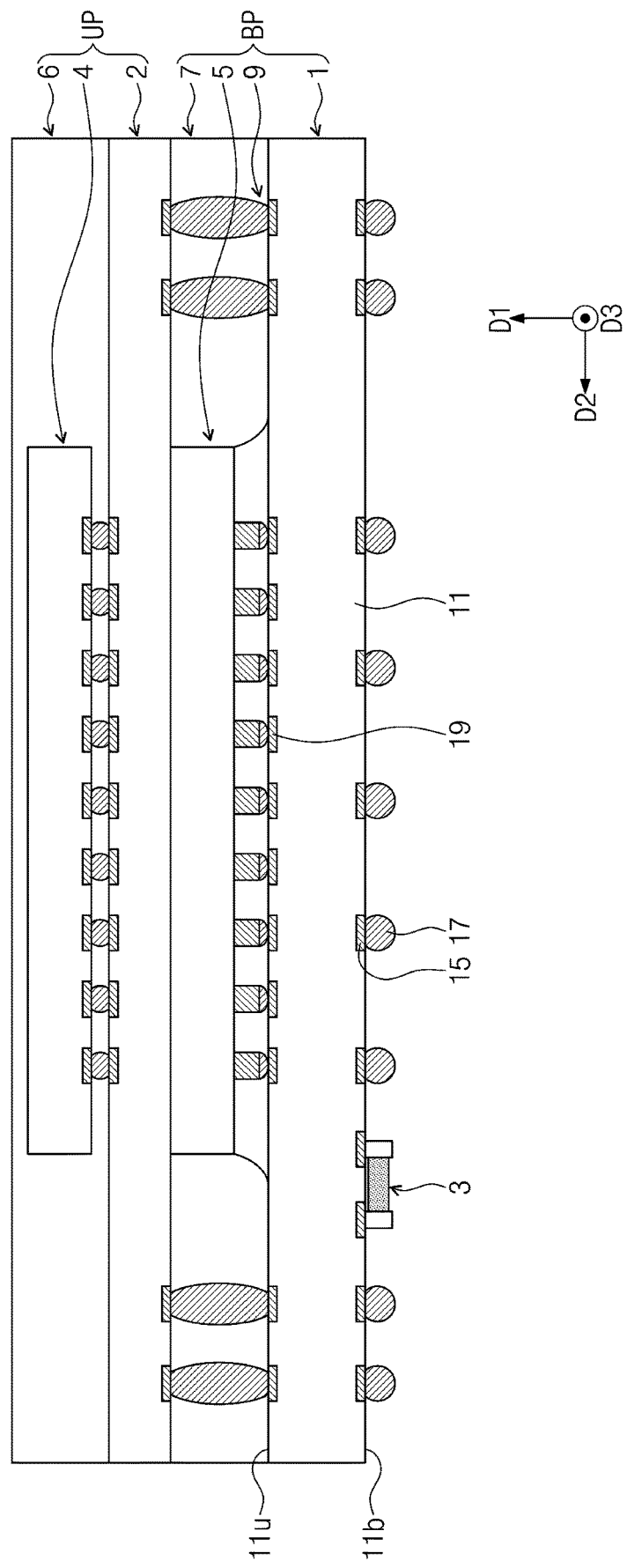

Referring to the embodiment of FIG. 14, an upper semiconductor chip 4 may be mounted on the upper substrate 2 and an upper molding layer 6 may be formed thereon. For example, an upper package part UP coupled on a lower package part BP may be completed.

Figure 15:
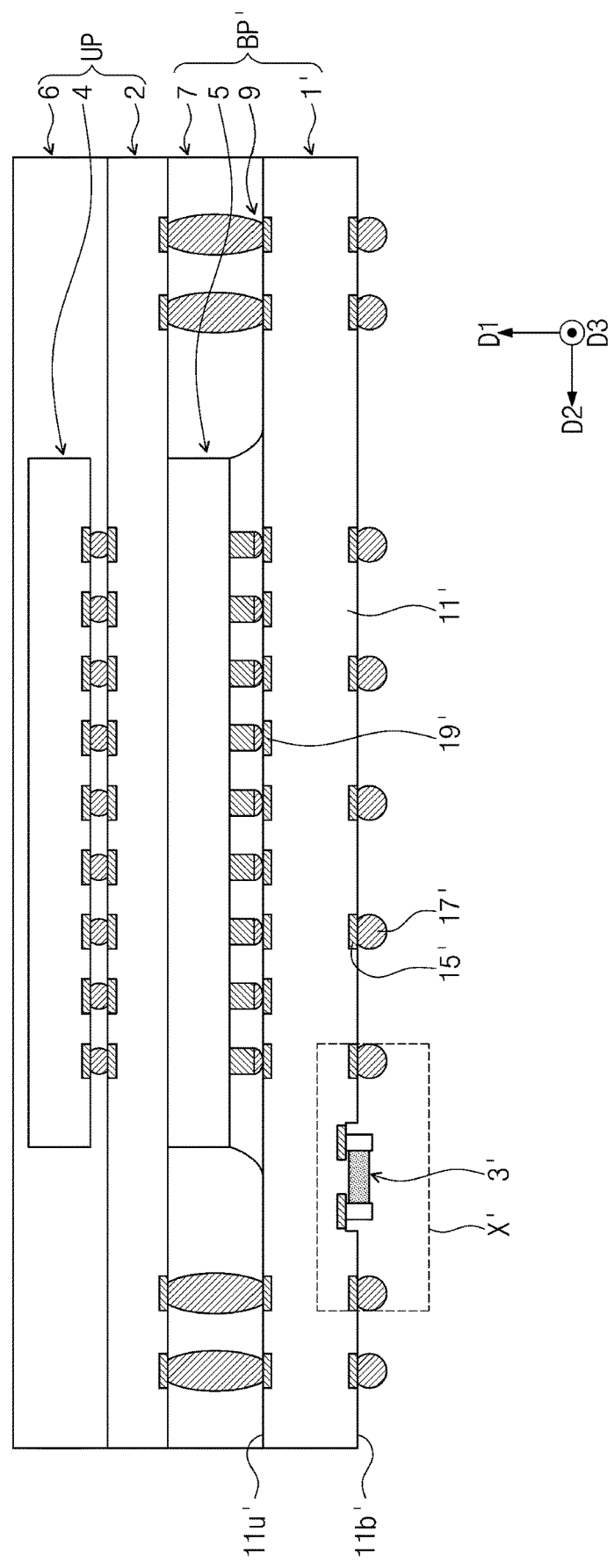
FIG. 15 is a cross-sectional view illustrating a semiconductor package according to an embodiment of the present inventive concepts.
Figure 16:
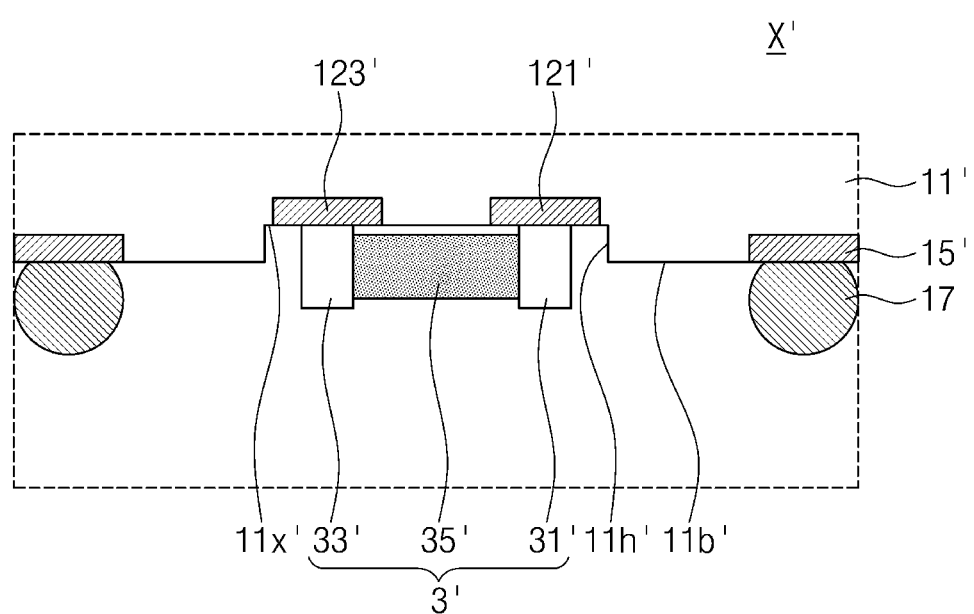
FIG. 16 is an enlarged cross-sectional view of region 'X'' of FIG. 15 according to an embodiment of the present inventive concepts.

FIG. 15 is a cross-sectional view illustrating a semiconductor package according to an embodiment of the present inventive concepts, and FIG. 16 is an enlarged cross-sectional view of a region X' of FIG. 15.

Hereinafter, a repeated description of substantially same/ similar features as mentioned with reference to the embodiments of FIGS. 1 to 14 will be omitted for the purpose of ease and convenience in explanation.

Referring to FIG. 15, a passive element 3' may be coupled to a substrate 1'.

Referring to FIG. 16, a second surface 11b' of the substrate 1' may provide a recess hole 11h'. The recess hole 11h' may be recessed upwardly from the second surface 11b' (e.g., in the first direction D1). A first passive element pad 121' and a second passive element pad 123' may be disposed in the recess hole 11h'. For example, the first passive element pad 121' and the second passive element pad 123' may be exposed by a recess surface 11x' defining the recess hole 11h'. A portion of the passive element 3' may be disposed in the recess hole 11h'. For example, a first electrode portion 31' of the passive element 3' may be coupled to the first passive element pad 121', and a second electrode portion 33' of the passive element 3' may be coupled to the second passive element pad 123'. Upper surfaces of the first electrode portion 31' and the second electrode portion 33' may be disposed in the recess hole 11h' and may be coupled to (e.g., electrically connected to) the first and second passive element pads 121', 123', respectively.

Figure 17:
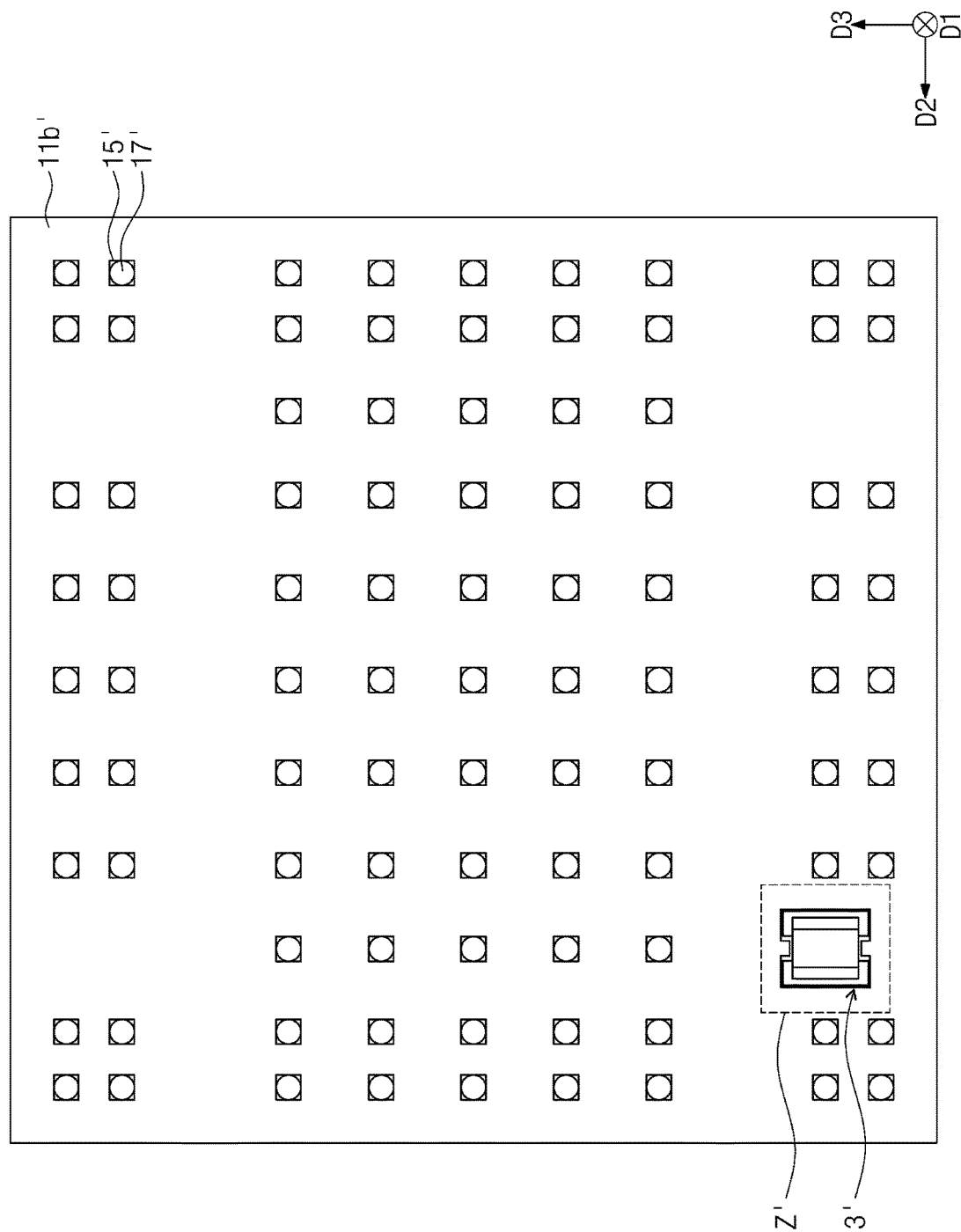
FIG. 17 is a bottom view illustrating a semiconductor package according to an embodiment of the present inventive concepts.
Figure 18:
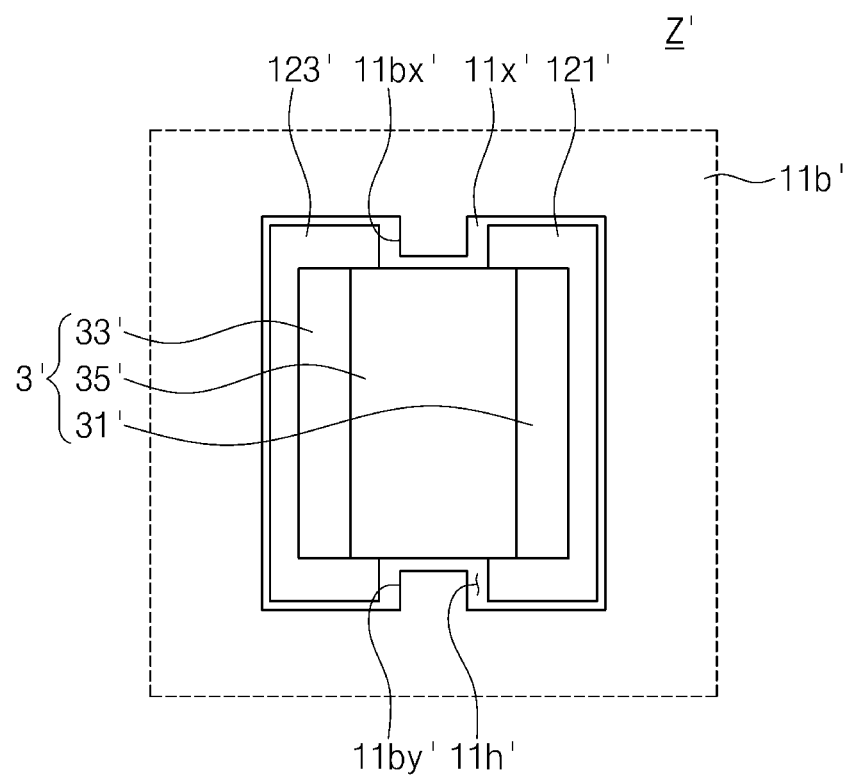
FIG. 18 is an enlarged bottom view of a region Z' of FIG. 17 according to an embodiment of the present inventive concepts.

FIG. 17 is a bottom view illustrating a semiconductor package according to an embodiment of the present inventive concepts, and FIG. 18 is an enlarged bottom view of a region 'Z'' of FIG. 17.

Referring to the embodiments of FIGS. 17 and 18, the passive element 3' may be disposed in the recess hole 11h'. A portion of the second surface 11b' of the substrate may protrude into the recess hole 11h'. For example, the second surface 11b' of the substrate may protrude into the recess hole 11h' to form a first dam 11bx' and a second dam 11by'. The first dam 11bx' and the second dam 11by' may be coplanar with the second surface 11b'. The first dam 11bx' and the second dam 11by' may be disposed between the first passive element pad 121' and the second passive element pad 123' (e.g., in the second direction D2). The passive element 3' may be disposed between the first dam 11bx' and the second dam 11by' (e.g., in the third direction D3). Even though the passive element 3' receives force while being coupled to the substrate, rotation of the passive element 3' may be prevented at a certain angle or greater by the first dam 11*bx'* and the second dam 11*by'*.

In the semiconductor package according to an embodiment of the present inventive concepts, the passive element may be disposed in the recess hole recessed from the bottom surface of the substrate. Thus, a portion of a thickness of the passive element may laterally overlap with a thickness of the substrate. As a result, a total volume of the semiconductor package may be reduced. In addition, since a portion of the passive element is disposed in the substrate, the connection ball coupled to the bottom surface of the substrate may not interfere with a process of coupling the connection ball to a main board even though a size of the connection ball is reduced. Thus, a yield of the semiconductor package may be increased.

According to the semiconductor package and the method of manufacturing the same in an embodiment of the present inventive concepts, the rotation of the passive element may be prevented.

According to the semiconductor package and the method of manufacturing the same in an embodiment of the present inventive concepts, an electrical short of the passive element may be prevented.

According to the semiconductor package and the method of manufacturing the same in an embodiment of the present inventive concepts, the yield of the semiconductor package may be increased.

According to the semiconductor package and the method of manufacturing the same in an embodiment of the present inventive concepts, the total volume may be reduced.

While the present inventive concepts have been described with reference to example embodiments, it will be apparent to those skilled in the art that various changes and modifications may be made without departing from the spirit and scope of the present inventive concepts. Therefore, it should be understood that the above embodiments are not limiting, but illustrative. Thus, the scope of the present inventive concepts shall not be restricted or limited by the foregoing description of example embodiments.

What is claimed is:

1. A semiconductor package comprising:
   a substrate having a top surface and a bottom surface opposite to the top surface in a thickness direction of the substrate;
   a semiconductor chip on the top surface of the substrate; and
   a passive element on the bottom surface of the substrate,
   wherein the substrate comprises:
   a first passive element pad and a second passive element pad that are exposed by the bottom surface; and
   a dam extending downwardly from the bottom surface, the dam including a first dam and a second dam,
   wherein the passive element is disposed between the first dam and the second dam on the bottom surface of the substrate,
   wherein the passive element comprises:
   a first electrode portion electrically connected to the first passive element pad; and
   a second electrode portion electrically connected to the second passive element pad.

2. The semiconductor package of claim 1, wherein a thickness of each of the first and second dams is less than a thickness of the passive element.

3. The semiconductor package of claim 1, wherein the substrate further comprises:
   a connection pad exposed by the bottom surface; and
   a connection ball coupled to the connection pad.

4. The semiconductor package of claim 3, wherein a thickness of the passive element is less than a thickness of the connection ball.

5. The semiconductor package of claim 4, wherein the thickness of the passive element is in a range from about 50 µm to about 130 µm.

6. The semiconductor package of claim 1, wherein the passive element includes a decoupling capacitor.

7. The semiconductor package of claim 1, wherein each of the first and second dams is disposed between the first passive element pad and the second passive element pad when viewed in a plan view.

8. The semiconductor package of claim 1, wherein each of the first and second dams includes a solder resist (SR).

9. A semiconductor package comprising:
   a substrate;
   a semiconductor chip on a top surface of the substrate in a thickness direction of the substrate; and
   a passive element on a bottom surface of the substrate in the thickness direction of the substrate,
   wherein the substrate comprises:
   a first passive element pad and a second passive element pad that are exposed by the bottom surface of the substrate;
   a dam extending downwardly from the bottom surface of the substrate,
   wherein the dam is disposed between the first passive element pad and the second passive element pad when viewed in a plan view,
   wherein the passive element comprises:
   a first electrode portion electrically connected to the first passive element pad; and
   a second electrode portion electrically connected to the second passive element pad.

10. The semiconductor package of claim 9, wherein the substrate further comprises:
    a connection pad exposed by the bottom surface of the substrate; and
    a connection ball coupled to the connection pad,
    wherein a thickness of the passive element is less than a thickness of the connection ball.

11. The semiconductor package of claim 10, wherein the thickness of the passive element is in a range of about 50 µm to about 130 µm.

12. The semiconductor package of claim 9, wherein:
    the dam includes a first dam and a second dam; and
    the passive element is disposed between the first dam and the second dam, and
    wherein a thickness of each of the first and second dams is less than a thickness of the passive element.

13. The semiconductor package of claim 9, wherein the dam includes a same material as a material forming the bottom surface of the substrate.

14. The semiconductor package of claim 9, wherein the passive element includes a decoupling capacitor.

15. A semiconductor package comprising:
    a substrate having a top surface and a bottom surface, the top surface is spaced apart from the bottom surface in a first direction that is a thickness direction of the substrate;
    a semiconductor chip on the top surface of the substrate;
    a molding layer disposed on the top surface and surrounding the semiconductor chip;
    an upper package part on the molding layer; and
    a passive element on the bottom surface of the substrate,
    wherein the substrate comprises:
    a first passive element pad exposed by the bottom surface;

a second passive element pad exposed by the bottom surface and spaced apart from the first passive element pad in a second direction intersecting the first direction; and a dam extending from the bottom surface in a direction opposite to the first direction, wherein the dam comprises:

a first dam disposed between the first passive element pad and the second passive element pad when viewed in a plan view; and a second dam disposed between the first passive element pad and the second passive element pad in a plan view and spaced apart from the first dam in a third direction intersecting the first direction and the second direction, wherein the passive element is disposed between the first dam and the second dam, wherein the passive element comprises:

a first electrode portion electrically connected to the first passive element pad; and a second electrode portion electrically connected to the second passive element pad.

16. The semiconductor package of claim 15, wherein the substrate further comprises:

a connection pad exposed by the bottom surface; and a connection ball coupled to the connection pad, wherein a thickness of the passive element is less than a thickness of the connection ball.

17. The semiconductor package of claim 16, wherein the thickness of the passive element is in a range from about 50 µm to about 130 µm.

18. The semiconductor package of claim 15, wherein a thickness of each of the first and second dams is less than a thickness of the passive element.

19. The semiconductor package of claim 15, wherein:

the first passive element pad is electrically connected to a power electrode; and the second passive element pad is electrically connected to a ground electrode.

20. The semiconductor package of claim 15, wherein each of the first and second dams includes a same material as a material forming the bottom surface of the substrate.

* * * * *